United States Patent
Katsuki

(10) Patent No.: US 8,492,815 B2
(45) Date of Patent: Jul. 23, 2013

(54) SEMICONDUCTOR MEMORY

(75) Inventor: Nobuyuki Katsuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 165 days.

(21) Appl. No.: 12/652,299

(22) Filed: Jan. 5, 2010

(65) Prior Publication Data
US 2010/0171160 A1 Jul. 8, 2010

(30) Foreign Application Priority Data
Jan. 7, 2009 (JP) .................... 2009-1943

(51) Int. Cl.
*H01L 27/108* (2006.01)
*H01L 29/94* (2006.01)

(52) U.S. Cl.
USPC .................. 257/300; 257/E27.088

(58) Field of Classification Search
USPC .............. 257/E27.084, E27.088, E21.646, 257/306, 296, 300
See application file for complete search history.

(56) References Cited

U.S. PATENT DOCUMENTS

| | | | | |
|---|---|---|---|---|
| 6,097,621 A | * | 8/2000 | Mori | 365/63 |
| 6,207,574 B1 | * | 3/2001 | Lee | 438/703 |
| 7,432,597 B2 | * | 10/2008 | Kitamura et al. | 257/758 |
| 7,602,002 B2 | * | 10/2009 | Inoue et al. | 257/309 |
| 7,659,567 B2 | * | 2/2010 | Aoki | 257/306 |
| 7,851,303 B2 | * | 12/2010 | Mikasa | 438/253 |
| 8,053,360 B2 | * | 11/2011 | Yamazaki | 438/639 |
| 2002/0005542 A1 | | 1/2002 | Hayano et al. | |
| 2003/0132462 A1 | * | 7/2003 | Iijima et al. | 257/213 |
| 2004/0004257 A1 | | 1/2004 | Lee et al. | |
| 2007/0063242 A1 | * | 3/2007 | Doyle | 257/296 |
| 2007/0241380 A1 | * | 10/2007 | Hasunuma | 257/296 |
| 2008/0197392 A1 | | 8/2008 | Sakoh et al. | |
| 2008/0308854 A1 | * | 12/2008 | Takaishi | 257/304 |
| 2010/0237394 A1 | * | 9/2010 | Park et al. | 257/296 |
| 2010/0283091 A1 | * | 11/2010 | Park | 257/296 |

FOREIGN PATENT DOCUMENTS

| | | |
|---|---|---|
| JP | 11-045982 | 2/1999 |
| JP | 2002-031883 | 1/2002 |
| JP | 2004-047999 | 2/2004 |
| JP | 2007-287794 | 11/2007 |
| JP | 2008-227477 | 9/2008 |

* cited by examiner

*Primary Examiner* — Matthew Landau
*Assistant Examiner* — Latanya N Crawford
(74) *Attorney, Agent, or Firm* — Young & Thompson

(57) ABSTRACT

A semiconductor memory includes a DRAM having, as seen in planar view, a first bit line and a second bit line formed on a first active area, a first cell contact formed on the first active area, and a first capacitor contact formed on the first cell contact and which is connected to a capacitor. As seen in planar view, the first cell contact is positioned closer to the second bit line than to the first bit line, and the first capacitor contact is formed offset in a direction approaching the first bit line with respect to the first cell contact.

16 Claims, 14 Drawing Sheets

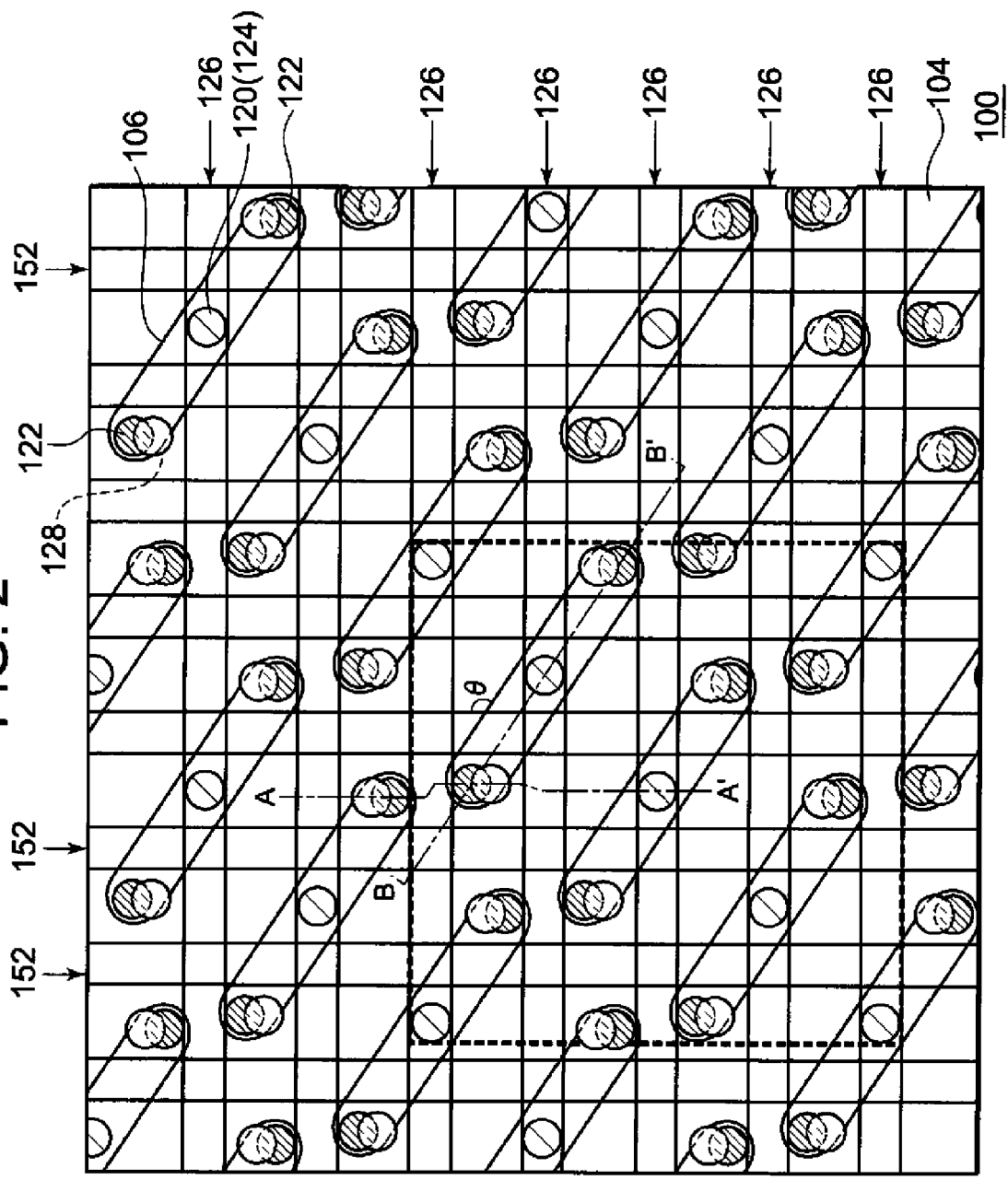

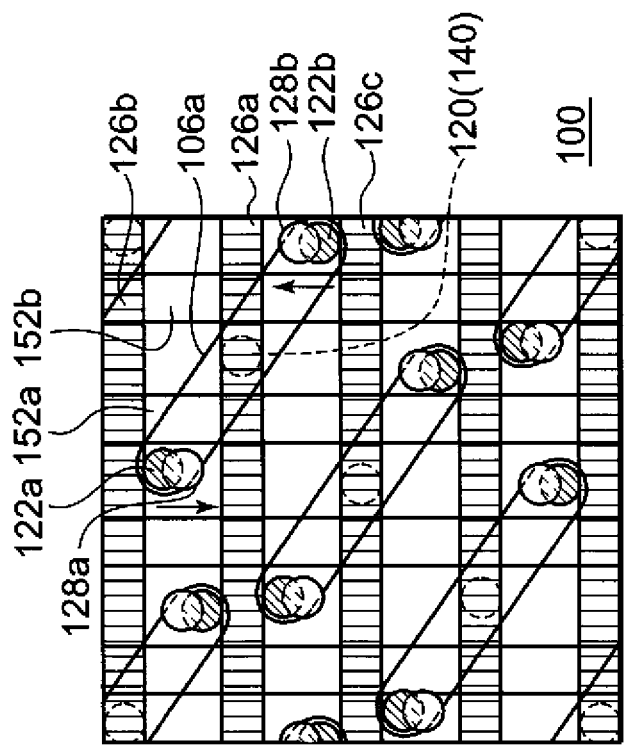
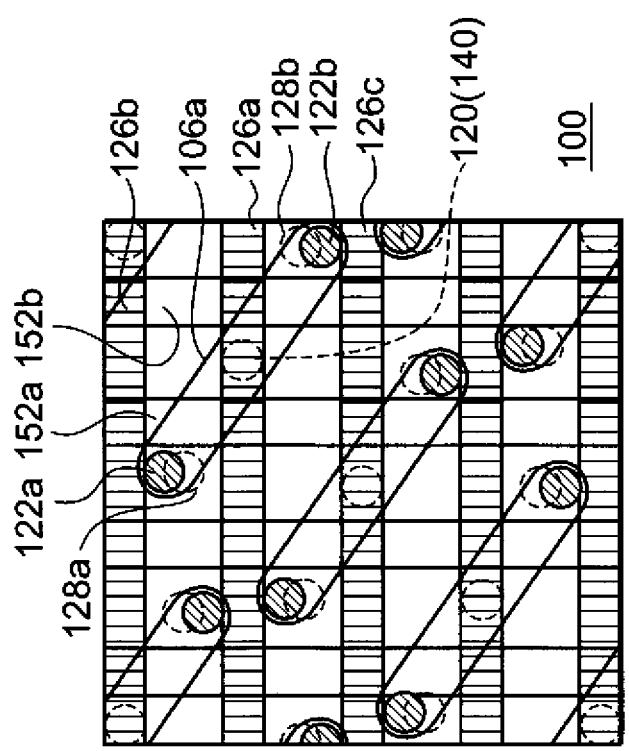

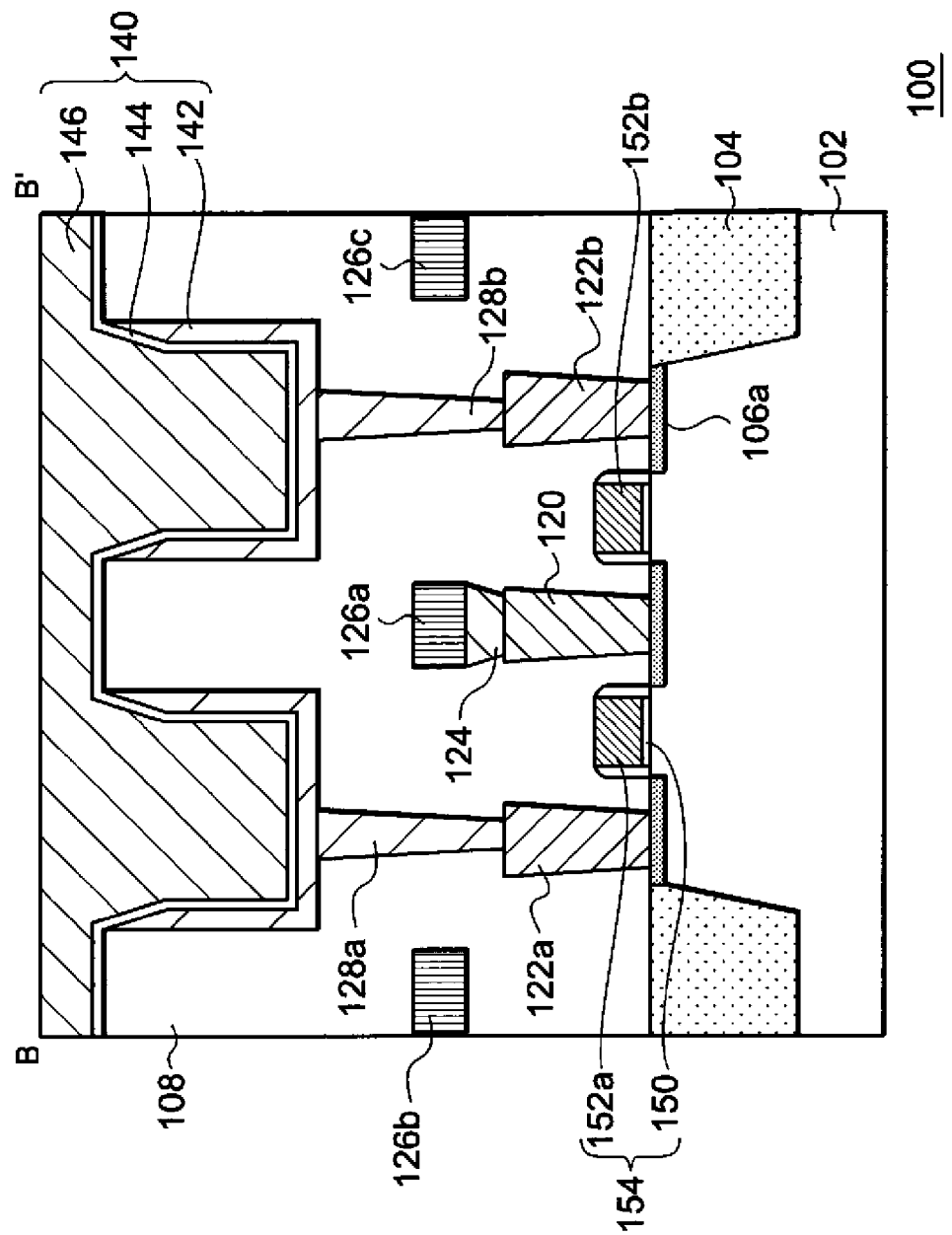

SEMICONDUCTOR MEMORY

This application is based on Japanese Patent Application No. 2009-001943 filed in Japan.

BACKGROUND OF THE INVENTION

The present invention relates to a semiconductor memory. Conventionally, various layouts have been considered for semiconductor memories that include a DRAM (dynamic random access memory).

Japanese Patent Laid-Open No. 2007-287794 discloses a semiconductor memory including a first cell contact and a bit line contact (bit contact) formed on the first cell contact, a second cell contact (cell contact) and a storage node contact (capacitor contact) formed on the second cell contact, and a capacitor formed on the storage node contact. In this case, a center position of the storage node contact is offset in a predetermined direction from a center position of the second cell contact and is moved in a direction approaching the first cell contact in the same active area. Accordingly, the disclosure purports that a closest-packed layout of the storage capacitor can be realized and a sufficient HSG (hemispherical grained) obstruction margin can be secured.

Japanese Patent Laid-Open No. 2004-47999 discloses a DRAM cell including first and second storage nodes (capacitor contacts) respectively formed on both ends of a single active area on a semiconductor substrate having first and second MOS transistors. The first and second storage nodes are respectively electrically connected to a first impurity region that acts as a source region of the first MOS transistor and a second impurity region that acts as a source region of the second MOS transistor. The central axes of the first and second storage nodes respectively pass through first and second points that are spaced from center points of the first and second impurity regions by a predetermined distance along a direction parallel to the longitudinal direction of the active area. In this case, the storage nodes (capacitor contacts) are moved by a predetermined distance in a direction perpendicular to the longitudinal direction of the active area (cell). The first and the second storage nodes are also moved in the same direction.

Japanese Patent Laid-Open No. 11-045982 discloses a semiconductor integrated circuit device configured such that an active area enclosed by a field isolation film on a primary face of a semiconductor substrate is linearly formed, and a bit line BL to be connected to a semiconductor region at the center of the active area is also formed linearly. In addition, a contact hole to which the bit line BL is connected, and a contact hole connected to semiconductor regions on both ends of the active area and at which is formed a plug to be connected to an information storage capacitative element, are formed deviated in opposite directions from the center of a y-direction of the active area (an area parallel to a gate line). In this case, the active area is formed so as to extend in a direction approximately parallel to the bit line.

Japanese Patent Laid-Open No. 2002-031883 discloses a method of manufacturing a semiconductor integrated circuit device using a mask pattern formed on a photomask during a design phase so as to be arranged offset in a separating direction from a data line DL so that when transferring through holes onto a pair of contact holes on either side of the data line DL, the through holes are to be connected to the contact holes but not to the data line DL even when an offset of the pair of through holes on either side of the data line DL occurs.

The present inventor has discovered that a semiconductor memory including a DRAM illustrated in the plan view in FIG. 11 and in FIG. 12, which is a cross-sectional view taken along the line D-D' in FIG. 11, has the following problem. Here, a description will be given using an example where the DRAM has a ¼ pitch-layout structure in which a basic structure made up in units of four bit lines and four gate lines is repetitively arranged.

A semiconductor memory 50 is formed on one face of a substrate 52, and includes an active area 56 separated by an isolation film 54, a bit line 76, a gate line (word line) 98, a bit contact 70, a cell contact 72, a capacitor contact 78, and a capacitor 90. In FIG. 11, the line extending in a longitudinal direction in the diagram is the gate line 98 and the line extending in a horizontal direction in the diagram is the bit line 76. As illustrated in FIG. 12, the capacitor 90 is made up of a lower electrode 92, a capacitance insulating film 94, and an upper electrode 96. In addition, an insulating film 58 is formed on the substrate 52. The bit line 76, the gate line 98 (not illustrated in FIG. 12), the bit contact 70, the cell contact 72, the capacitor contact 78, and the capacitor 90 are formed in the insulating film 58.

The bit contact 70 connects the active area 56 of the substrate 52 with the bit line 76. In addition, the cell contact 72 and the capacitor contact 78 connect the active area 56 of the substrate 52 with the capacitor 90. In this case, the cell contact 72 and the capacitor contact 78 are formed at the same position as seen in planar view with the exception of unintended errors due to processing errors during manufacturing.

Furthermore, the bit line 76 and the capacitor contact 78 are set to be arranged so as not to come into contact with each other even when processing errors during manufacturing are taken into consideration. For example, the capacitor contact 78 is desirably arranged at the center of adjacent bit lines 76 in order to secure an overlapping margin. Moreover, to ensure a connection between the cell contact 72 and the active area 56, the cell contact 72 must be arranged at the center of the active area 56.

Meanwhile, the recent miniaturization of devices has resulted in the density variation in impurity ions in a channel region of a transistor having a greater impact on transistor characteristics. In order to lower the impact of such a density variation, an overlapping region (channel region) of the gate line (word line) 98 making up the gate electrode of the transistor and each active area 56 is preferably made as wide as possible. In order to increase DRAM arrangement density and secure a wide overlapping region of the gate line 98 and each active area 56, the active area 56 is desirably arranged so that a wide angle is formed between the extended direction of the active area 56 and the extended direction of the gate line 98.

FIG. 13 illustrates an example of a plan view of a semiconductor memory 50 configured as described above.

In this case, an angle θa formed by the extended direction of the gate line 98 and the active areas 56 is set wider than an angle θb of the configuration illustrated in FIG. 11. Such an arrangement ensures a wider overlapping region of the gate line 98 and each active area 56 when the intervals of adjacent gate lines 98 and the intervals of adjacent bit lines 76 are respectively set similar to those illustrated in FIG. 11. Accordingly, device characteristics can be improved and stabilized while maintaining DRAM arrangement density.

However, a configuration such as that illustrated in FIG. 13 has a problem in that an overlapping margin of the bit line 76 and the capacitor contact 78 cannot be secured. FIG. 14 is a cross-sectional view taken along line E-E' in FIG. 13. At the locations indicated by the arrows in the diagram, there is a risk that an insufficient margin between the bit line 76 and the capacitor contact 78 may lead to the bit line 76 coming into contact with the capacitor contact 78 due to processing errors during manufacturing.

The conventional techniques described above are incapable of solving such problems.

SUMMARY

The present invention provides a semiconductor memory including a DRAM having:

a substrate;

an isolation film formed on the substrate;

a first active area separated by the isolation film;

a first bit line formed on the first active area and a second bit line formed adjacent to the first bit line;

a capacitor provided on a higher-layer than the first bit line and the second bit line;

a cell contact formed connected to the first active area on the first active area;

a capacitor contact connecting the cell contact and the capacitor on the cell contact; and a bit contact connecting the first active area and the first bit line on the first active area, wherein the cell contact is provided at a position that is closer to the second bit line than to the first bit line, and a central axis of the capacitor contact is formed at a position that is closer to the first bit line than to a central axis of the cell contact.

According to the configuration described above, since the cell contact formed connected to the first active area can be arranged at a position close to the second bit line, arrangement density can be increased and device characteristics can be stabilized. In addition, by forming the capacitor contact so as to be offset in a direction approaching the first bit line, the capacitor contact can be arranged at the center between the first bit line and the second bit line. Accordingly, the overlapping margins between the respective bit lines and the capacitor contact can be widened.

Moreover, arbitrary combinations of the components described above, as well as mutual conversions of the expressions of the present invention among methods, apparatuses, and the like are also valid as aspects of the present invention.

BRIEF DESCRIPTION OF THE DRAWINGS

The above and other objects, advantages and features of the present invention will be more apparent from the following description taken in conjunction with the accompanying drawings, in which:

FIG. 2 is a plan view illustrating a configuration of a semiconductor memory according to the first embodiment of the present invention;

FIGS. 3A and 3B are plan views illustrating the portions enclosed by dashed lines in FIG. 1 and FIG. 2;

FIG. 5 is a cross-sectional view taken along line B-B' in FIG. 2;

DETAILED DESCRIPTION OF PREFERRED EMBODIMENTS

Figure 1:
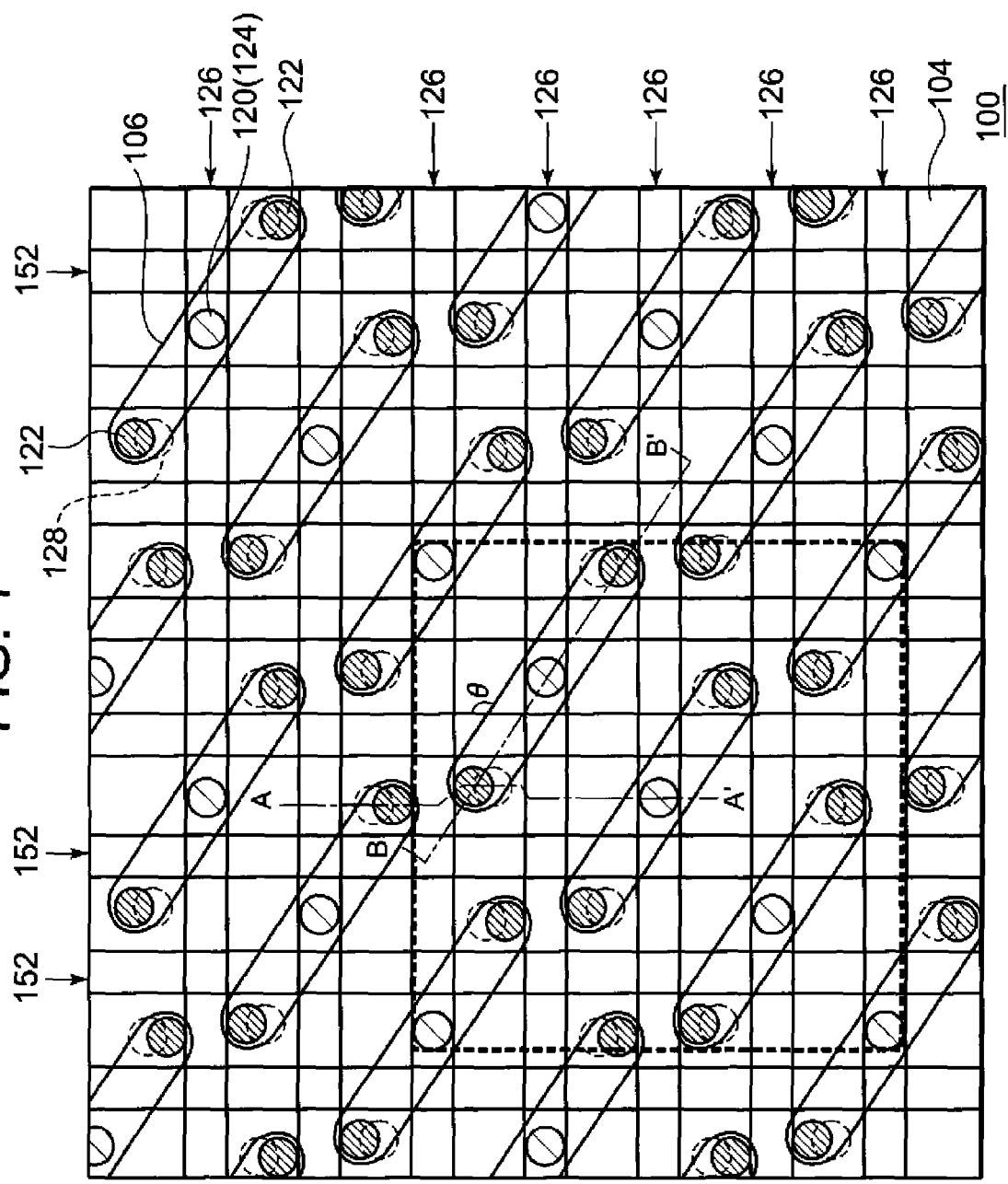
FIG. 1 is a plan view illustrating a configuration of a semiconductor memory according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings. Throughout all of the drawings, like components will be denoted by like reference characters and descriptions thereof will be omitted where appropriate. In the embodiments, semiconductor memories are to include a DRAM.

First Embodiment

Figure 4:
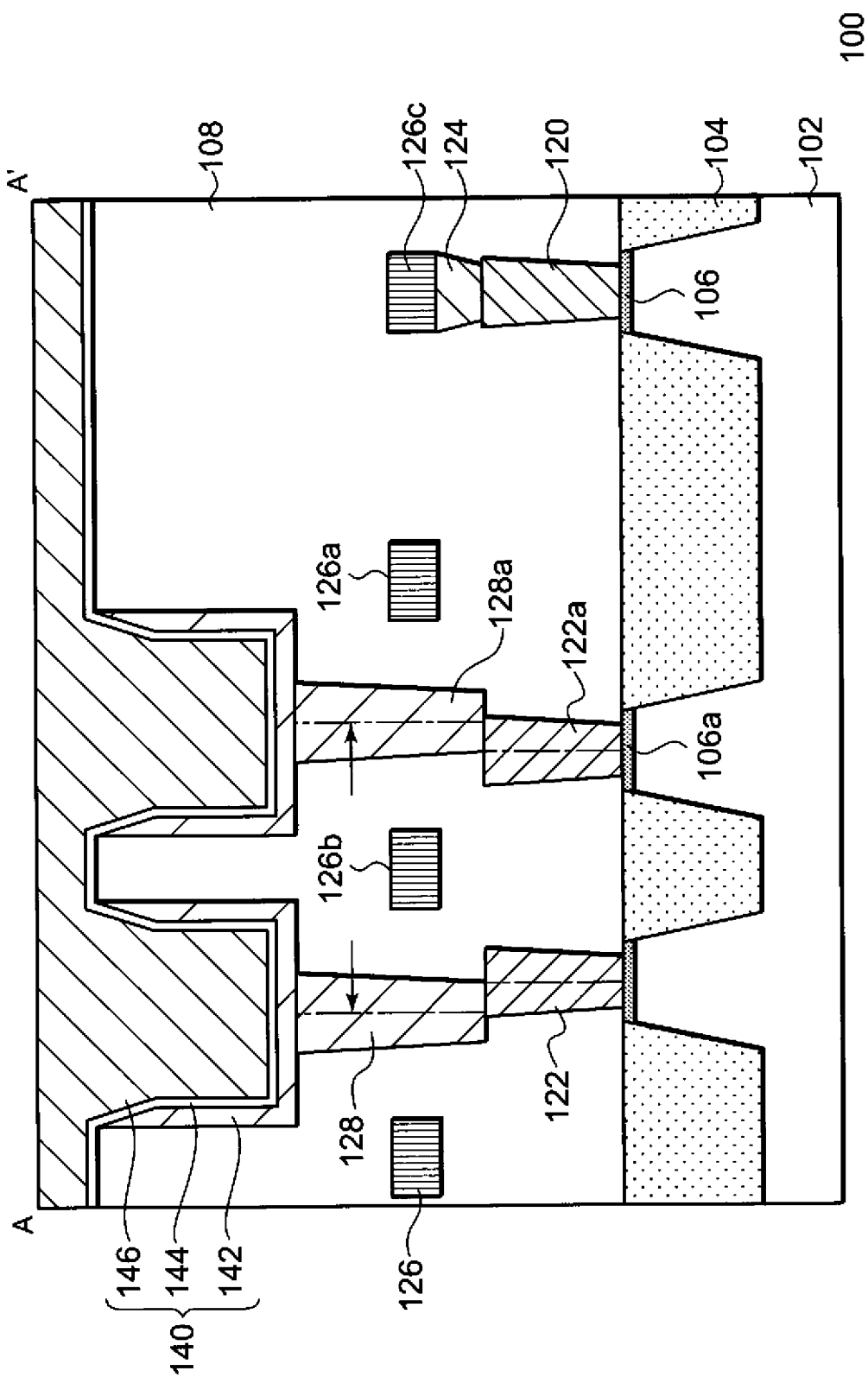
FIG. 4 is a cross-sectional view taken along line A-A' in FIG. 2.

FIG. 1 and FIG. 2 are plan views illustrating a configuration of a semiconductor memory according to a first embodiment of the present invention. In addition, FIG. 3 is a plan view illustrating the locations enclosed by the dashed lines in FIG. 1 and FIG. 2. FIG. 4 is a cross-sectional view taken along line A-A' in FIG. 2. Furthermore, FIG. 5 is a cross-sectional view taken along line B-B' in FIG. 2.

A semiconductor memory 100 includes: a substrate 102; an active area 106 formed on one face of the substrate 102 and which is separated by an isolation film 104; a bit line (data line) 126 formed on the substrate 102; a capacitor 140 provided on a higher layer than the bit line 126; a cell contact 122 formed connected to the active area 106 on the active area 106; a capacitor contact 128 formed connected to the cell contact 122 on the cell contact 122; and a lower-layer bit contact 120 and an upper-layer bit contact 124 formed connected to the active area 106 on the active area 106 and which are connected to the bit line 126. The semiconductor memory 100 further includes a gate line (word line) 152 formed on the substrate 102 and a field-effect transistor (FET) 154 that includes the gate line 152 as a gate thereof. In FIG. 1, the capacitor contact 128 is indicated by a dashed line so as to better illustrate the positional relationship between the capacitor contact 128 and the cell contact 122.

In the present embodiment, an extended direction of the bit line 126 (left-right directions in FIG. 1 and FIG. 2) and an extended direction of the gate line 152 (up-down directions in FIG. 1 and FIG. 2) can be set so as to form an approximate right angle.

In addition, if θ denotes an angle formed by an extended direction of the gate line 152 and an extended direction of the active area 106, then θ satisfies 90<θ<180 degrees. That is, the active area 106 extends in an oblique direction or, in other words, a direction inconsistent with an extended direction of the bit line 126 or with a direction perpendicular to the extended direction of the bit line 126. The angle θ preferably satisfies 120≦θ≦150 degrees. The respective active areas 106 are separated from each other by the isolation film 104 that is STI (shallow trench isolation) or the like. Each active area 106 is formed oblique with respect to the gate lines 152 and the bit lines 126 so as to intersect two gate lines 152 and one bit line 126.

In the present embodiment, the DRAM has a ¼ pitch-layout structure in which a basic structure made up in units of four bit lines 126 and four gate lines 152 is repetitively arranged. In FIG. 1 and FIG. 2, the basic structure and a neighboring region thereof are enclosed by dashed lines.

In addition, for the sake of description, as illustrated in FIG. 3, one of the active areas 106 is depicted as a first active area 106a and reference characters are respectively assigned to the bit line 126, the gate line 152, and the like in the vicinity of the first active area 106a. FIG. 3A illustrates the portion enclosed by the dashed line in FIG. 1. FIG. 3B illustrates the portion enclosed by the dashed line in FIG. 2. In addition, for better understanding, the bit lines 126 are depicted using a hatched pattern.

The diagrams illustrate, as bit lines 126, a first bit line 126a, a second bit line 126b provided adjacent to the first bit line 126a, and a third bit line 126c provided adjacent to the first bit line 126a on the other side of the second bit line 126b with the first bit line 126a therebetween. In addition, as the gate lines 152, a first gate line 152a and a second gate line 152b adjacent to the first gate line 152a are illustrated. The first bit line 126a is formed on the first active area 106a so as to intersect the first active area 106a as seen in planar view.

In addition, as the cell contacts 122, the diagrams illustrate a first cell contact 122a formed in a region between the first bit line 126a and the second bit line 126b and a second cell contact 122b formed in a region between the first bit line 126a and the third bit line 126c. Furthermore, as the capacitor contacts 128, the diagrams illustrate a first capacitor contact 128a formed connected to the first cell contact 122a on the first cell contact 122a and a second capacitor contact 128b formed connected to the second cell contact 122b on the second cell contact 122b.

In this case, as seen in planar view, the first cell contact 122a is positioned closer to the second bit line 126b than to the first bit line 126a, and the first capacitor contact 128a is formed offset in a direction approaching the first bit line 126a with respect to the first cell contact 122a. Similarly, as seen in planar view, the second cell contact 122b is positioned closer to the third bit line 126c than to the first bit line 126a, and the second capacitor contact 128b is formed offset in a direction approaching the first bit line 126a with respect to the second cell contact 122b.

In addition, in the present embodiment, the first capacitor contact 128a and the second capacitor contact 128b are formed along a direction parallel to the first gate line 152a so as to be respectively offset in a direction approaching the first bit line 126a with respect to the first cell contact 122a and the second cell contact 122b. In other words, the directions of movement of the first capacitor contact 128a and the second capacitor contact 128b are perpendicular to the extended direction of the first bit line 126a and parallel to the extended direction of the first gate line 152a.

Furthermore, as seen in planar view, the first capacitor contact 128a is formed approximately at the center between the first bit line 126a and the second bit line 126b. Similarly, the second capacitor contact 128b is formed approximately at the center between the first bit line 126a and the third bit line 126c.

As illustrated in FIG. 4 and FIG. 5, an insulating film 108 is formed on the substrate 102. While the insulating film 108 can have a laminated structure made up of a plurality of insulating films, the insulating film 108 is illustrated here without distinguishing the respective films. The substrate 102 is a semiconductor substrate such as a silicon substrate.

The bit lines 126 (126a to 126c) are connected to the active area 106 (106a) of the substrate 102 by the lower-layer bit contact 120 and the upper-layer bit contact 124. In other words, the lower-layer bit contact 120 and the upper-layer bit contact 124 connect the bit lines 126 and the active area 106 formed on the substrate 102. In the present embodiment, the lower-layer bit contact 120 is formed up to the same height as the cell contact 122. The bit lines 126 are formed on a higher layer than the upper-layer bit contact 124. That is, the bit lines 126 are formed such that lower faces thereof are positioned higher than an upper face of the cell contact 122 by just the height of the upper-layer bit contact 124. Due to this configuration, for example, it is possible to prevent the second bit line 126b and the first cell contact 122a from coming into contact with each other.

The capacitor 140 is made up of a lower electrode 142, a capacitor insulating film 144, and an upper electrode 146. In the present embodiment, the capacitor 140 is positioned on a higher layer than the bit lines 126. In other words, the DRAM described above has a COB (capacitor over bit-line) structure. The upper electrode 146 and the lower electrode 142 of the capacitor 140 are both made of metallic material.

The capacitor 140 is connected to the active area 106 (106a) of the substrate 102 by the cell contacts 122 (122a and 122b) and the capacitor contacts 128 (128a and 128b). In other words, the cell contacts 122 and the capacitor contacts 128 connect the capacitor 140 and the active area 106. The cell contacts 122 and the capacitor contacts 128 are respectively made up of conductive plugs.

As illustrated in FIG. 5, the FET 154 has source-drain regions (parts of the active area 106), a gate electrode (a part of the gate line 152), and a gate insulating film 150. The lateral faces of the gate electrode are covered with a sidewall insulating film. The FET 154 is connected to the bit line 126 via the lower-layer bit contact 120 and the upper-layer bit contact 124 and to the capacitor 140 via the cell contacts 122 and the capacitor contacts 128. Specifically, the bit line 126 is connected to one of the source-drain regions while the capacitor 140 is connected to the other source-drain region.

In the present embodiment, the semiconductor memory 100 can be manufactured by a procedure similar to a manufacturing procedure for an ordinary DRAM. A simple description will be given below.

First, after forming the isolation film 104 on the substrate 102, the FET 154 and the active area 106 are formed. Subsequently, an insulating film to become a part of the insulating film 108 is formed on the substrate 102. Next, contact holes are formed at locations of the insulating film corresponding to the lower-layer bit contact 120 and the cell contact 122. The contact holes and wiring grooves, to be described later, can be formed by forming a photoresist film having openings in a corresponding pattern on the insulating film, and etching the insulating film while using the photoresist film as a mask. The contact holes are then embedded by conductive material, whereby the conductive material exposed outside of the contact holes is removed by chemical mechanical polishing (CMP) or the like to form the lower-layer bit contact 120 and the cell contact 122.

Subsequently, an insulating film is further formed and a contact hole is formed at a location of the insulating film corresponding to the upper-layer bit contact 124. The contact hole is embedded by conductive material, whereby conductive material exposed outside of the contact hole is removed by CMP or the like to form the upper-layer bit contact 124. After forming a film with conductive material, patterning and etching is performed using a lithographic technique to form the bit line 126.

Subsequently, an insulating film is further formed and a contact hole is formed at a location of the insulating film corresponding to the capacitor contact 128. At this point, the opening pattern of the photoresist film to be used to form the capacitor contact 128 differs from a normal pattern. In other words, from the design phase, the opening pattern for forming the capacitor contact 128 is formed offset in a direction approaching the bit line 126 intersected by the corresponding active area 106 in comparison to the arrangement of the cell contact 122 formed therebelow. The contact hole is embedded by conductive material, whereby conductive material exposed outside of the contact hole is removed by CMP or the like to form the capacitor contact 128.

Subsequently, an insulating film is further formed and a recess is formed at a location of the insulating film corresponding to the lower electrode 142. Conductive material is formed in the recess, and a protective film is further formed so as to embed the recess. The protective film and the conductive material are removed by CMP or the like. Subsequently, the protective film is removed. Consequently, the lower electrode 142 is formed. Next, the capacitor insulating film 144 is formed on the lower electrode 142, and conductive material to become the upper electrode 146 is further formed on the capacitor insulating film 144 to embed the recess. Consequently, the semiconductor memory 100 is formed.

Advantages of the semiconductor memory 100 according to the present embodiment will now be described.

Figure 6B:
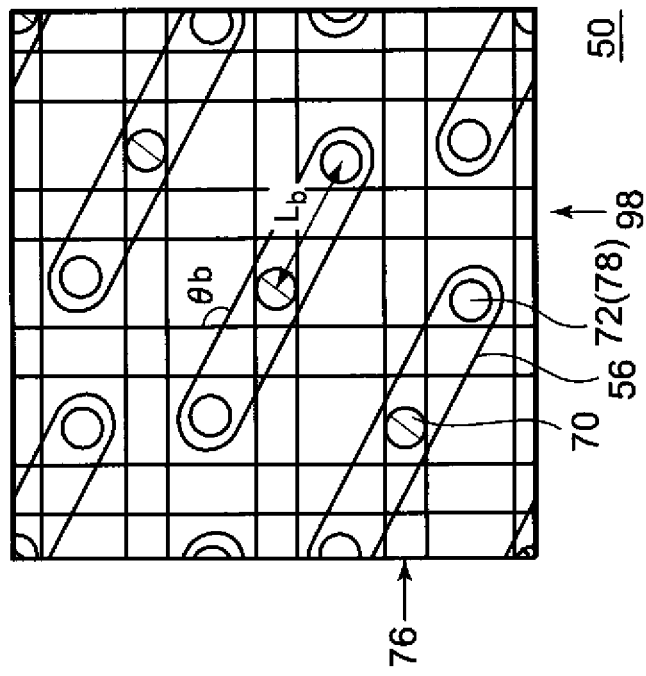
FIGS. 6A and 6B are plan views for describing the advantages of a semiconductor memory according to the first embodiment of the present invention.
Figure 6A:
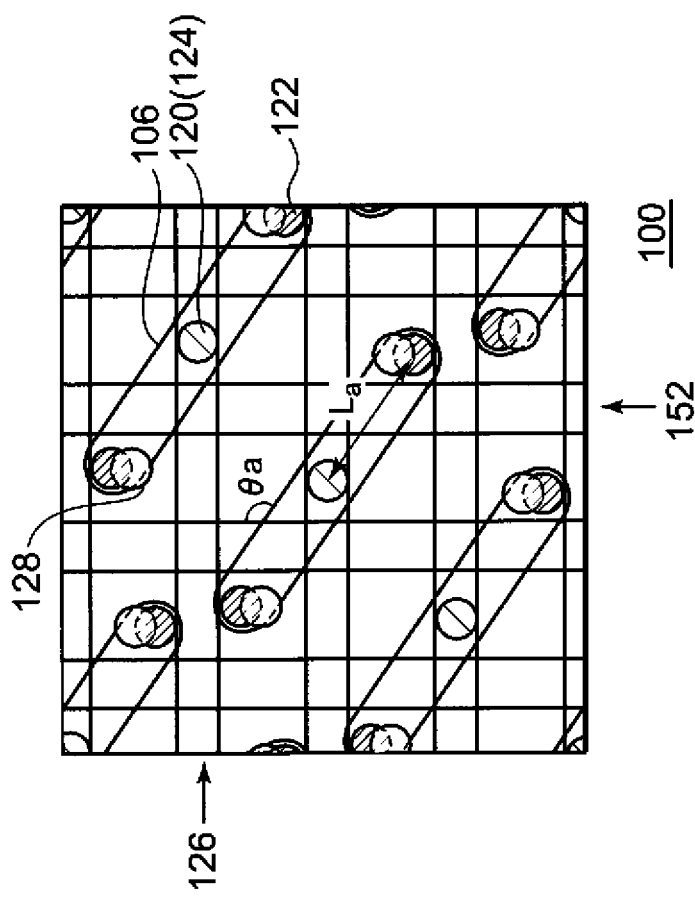
Figure 11:
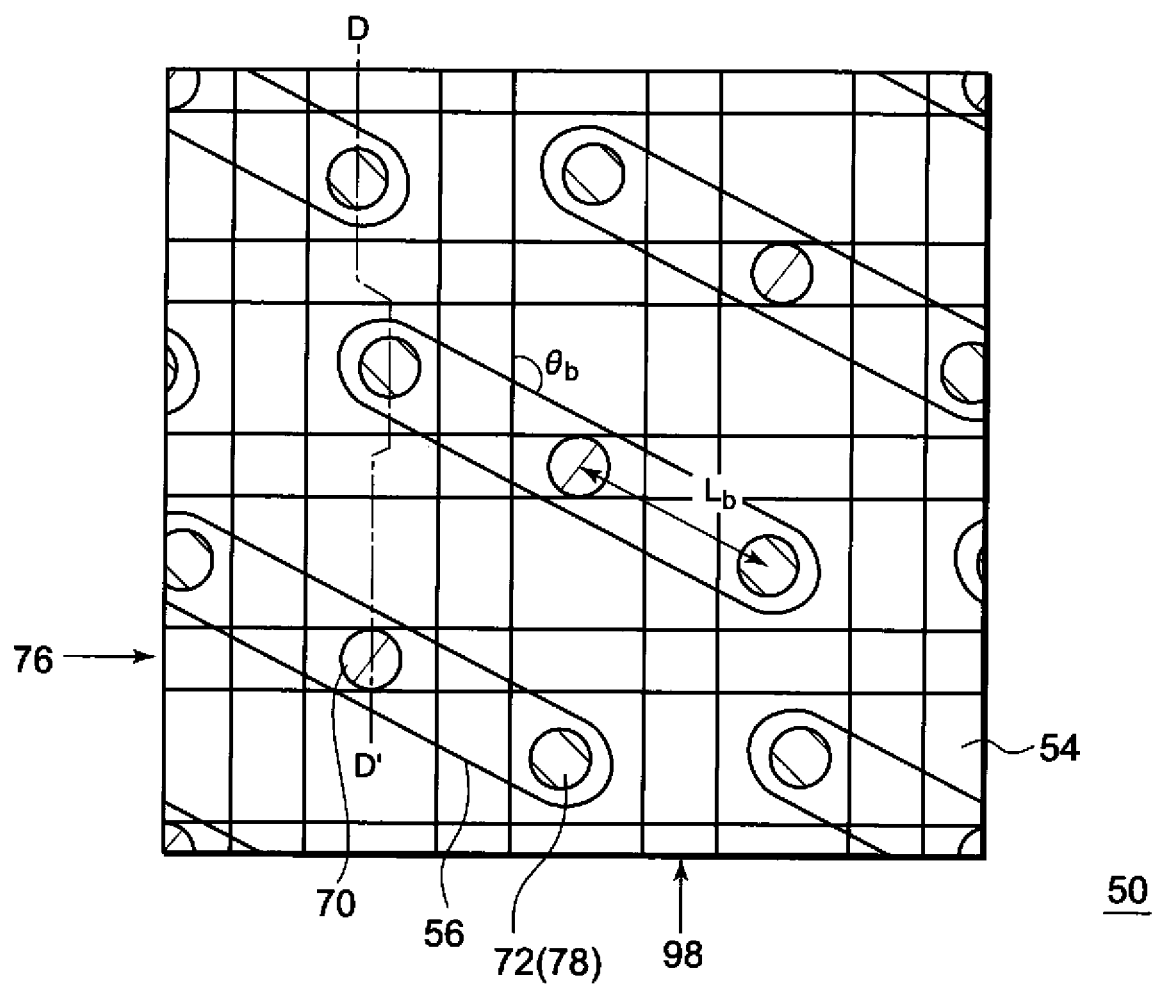
FIG. 11 is a plan view for describing an object of the present invention and which illustrates a configuration of a semiconductor memory including a DRAM.
Figure 12:
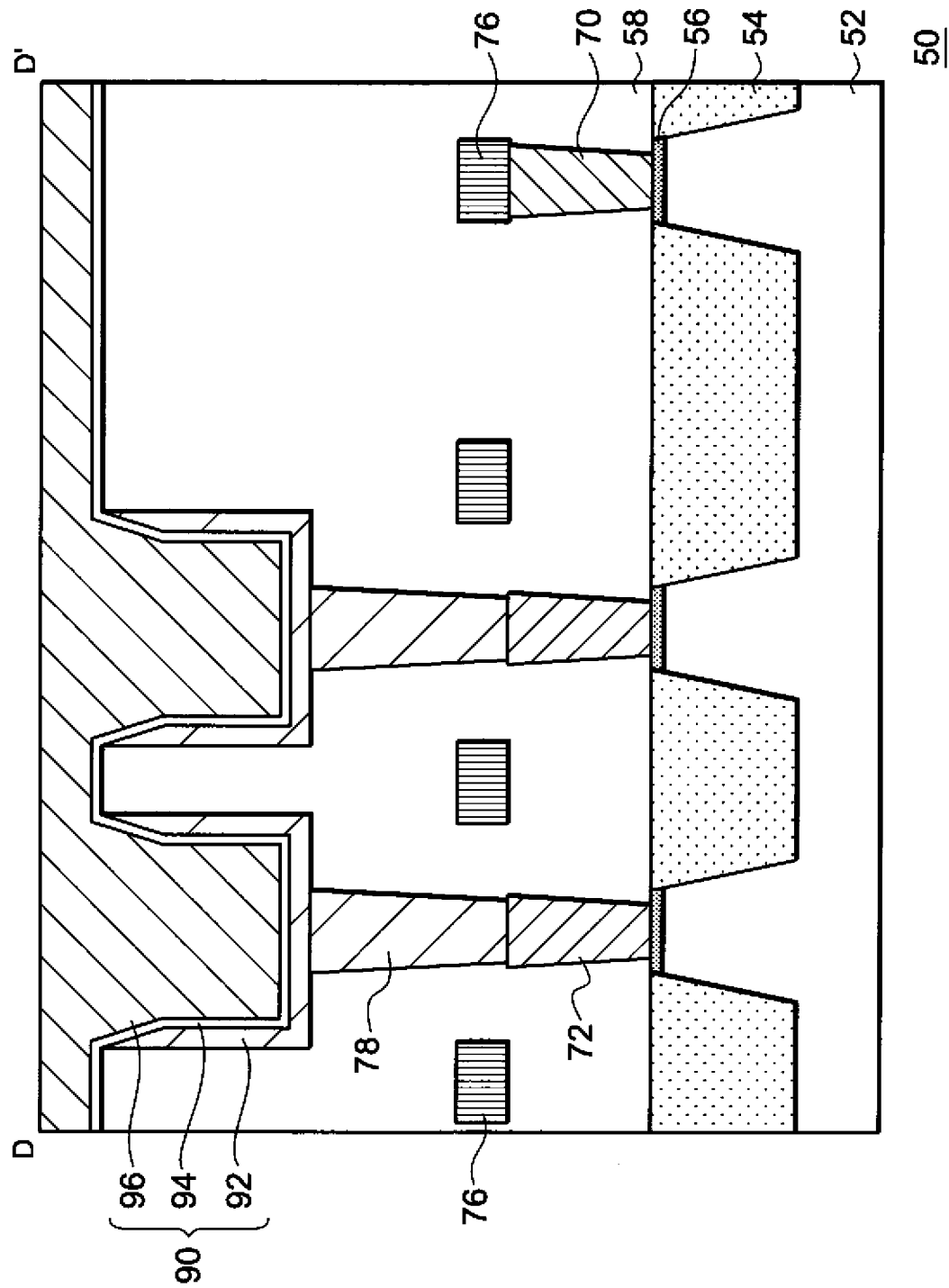
FIG. 12 is a cross-sectional view taken along line D-D' in FIG. 11.
Figure 13:
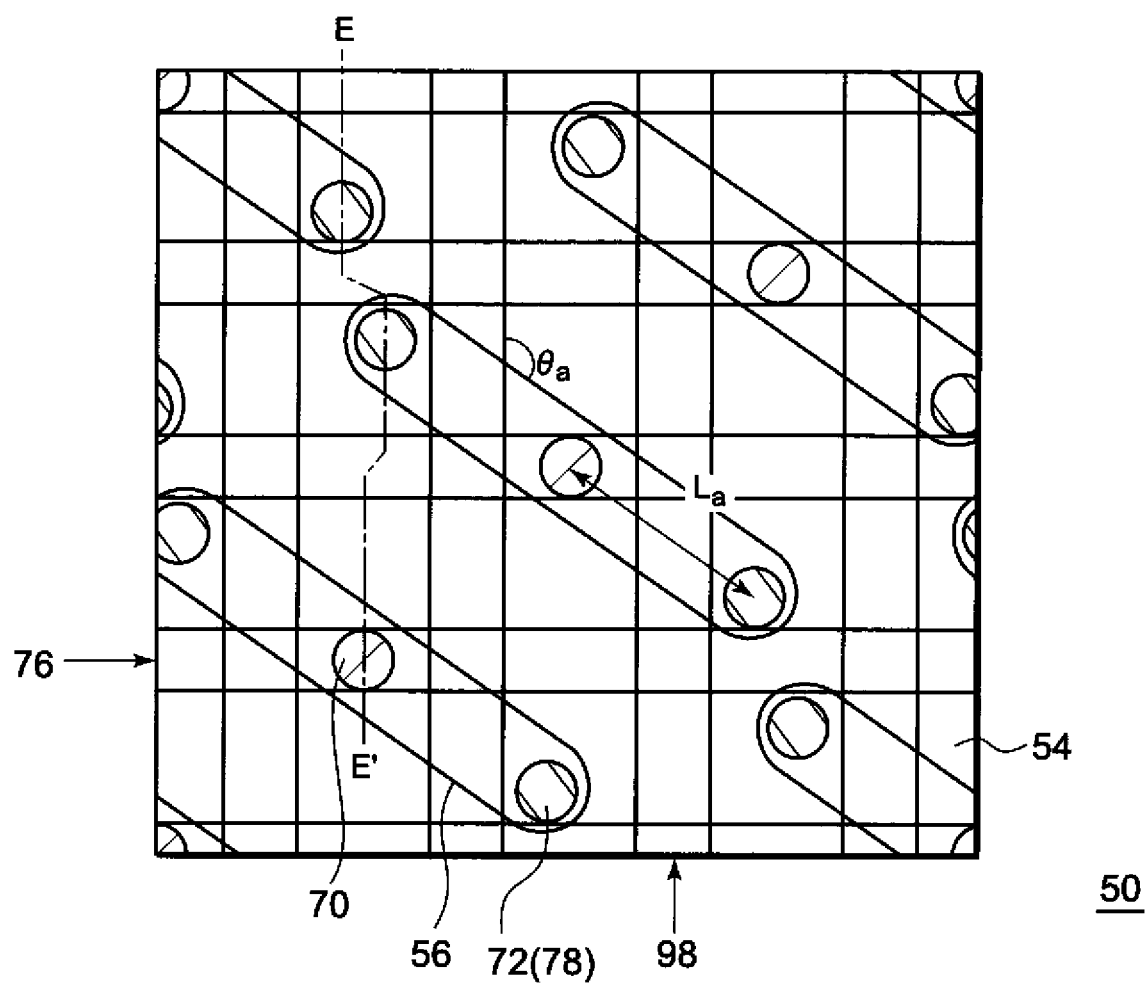
FIG. 13 is a plan view illustrating a configuration of a semiconductor memory that is the semiconductor memory illustrated in FIG. 11 with the layout thereof partially modified.
Figure 14:
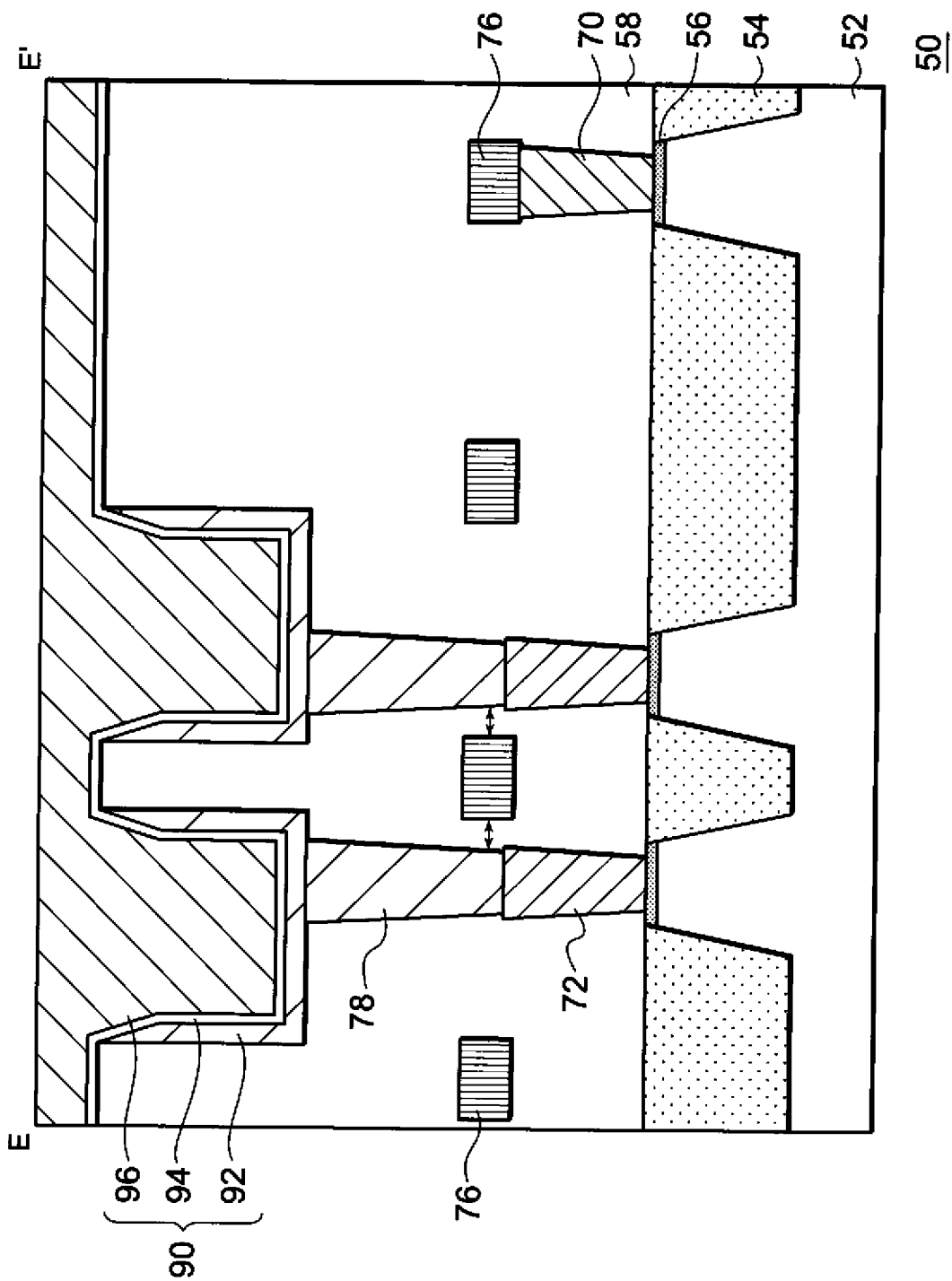
FIG. 14 is a cross-sectional view taken along line E-E' in FIG. 13.

FIG. 6 illustrates plan views for describing the advantages of the semiconductor memory 100 according to the present embodiment. FIG. 6A illustrates a configuration of the semiconductor memory 100 according to the present embodiment, and FIG. 6B illustrates a configuration of a semiconductor memory 50 including a conventional general DRAM similar to that illustrated in FIG. 11.

With the configuration of the semiconductor memory 100 according to the present embodiment, by arranging the pair of cell contacts 122 formed connected to one of the active areas 106 in a direction separating from the bit line 126 intersecting the active area 106, an angle θa between an extended direction of the gate line 152 and an extended direction of the active area 106 can be set wider than an angle θb of the configuration illustrated in FIG. 6B. Accordingly, an extended direction of the active area 106 can be approximated to a direction parallel to an extended direction of the gate line 152 and the overlapping region of the gate line 152 and the active area 106 can be widened. Consequently, the impact made by variations in impurity concentration can be reduced and device characteristics can be stabilized.

Furthermore, by forming the capacitor contact 128 offset in a direction approaching the bit line 126 that intersects the active area 106 to which the capacitor contact 128 is connected, it is possible to position the capacitor contact 128 at the center between the bit lines 126 on either side of the capacitor contact 128. Accordingly, the overlapping margins between the bit lines 126 and the capacitor contact 128 can be widened.

Second Embodiment

FIGS. 7 to 10 are plan views illustrating a configuration of a semiconductor memory 100 according to a second embodiment of the present invention.

Figure 7:
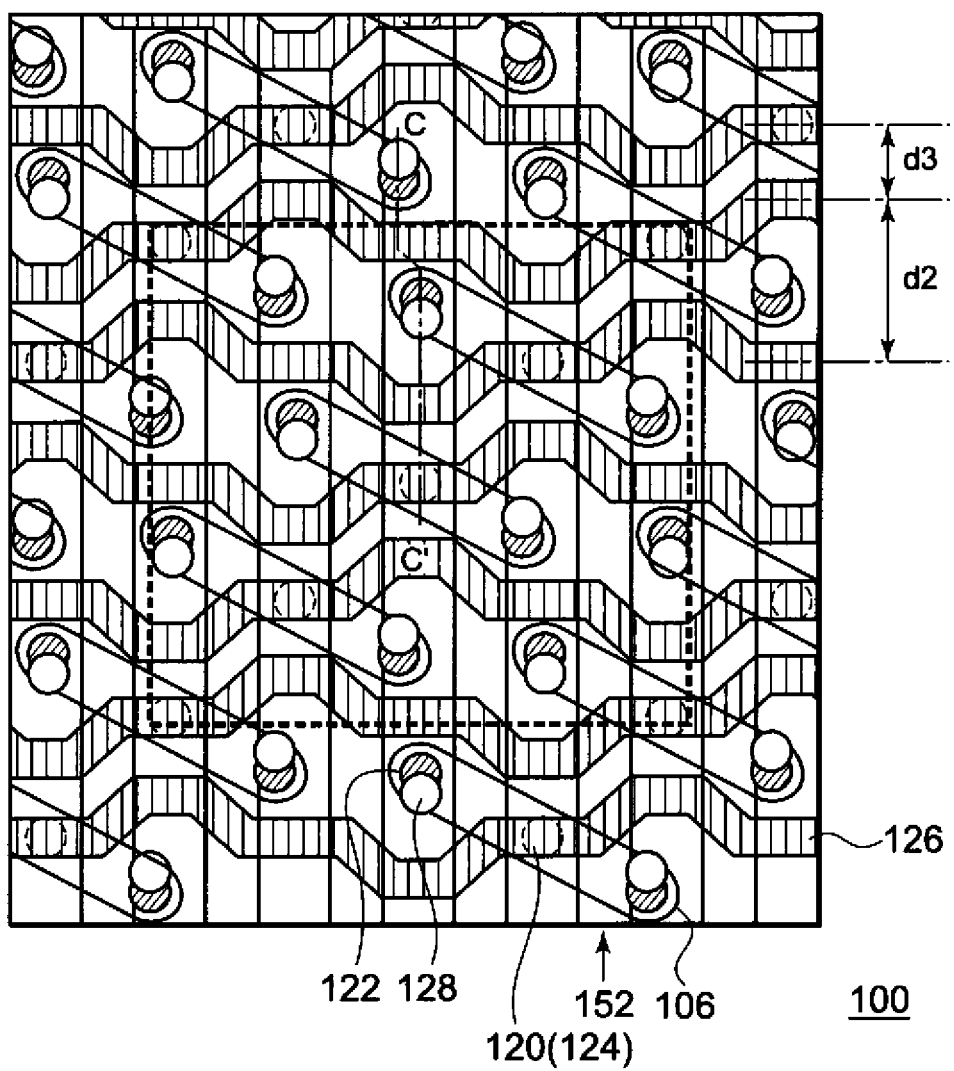
FIG. 7 is a plan view illustrating a configuration of a semiconductor memory according to a second embodiment of the present invention.
Figure 8:
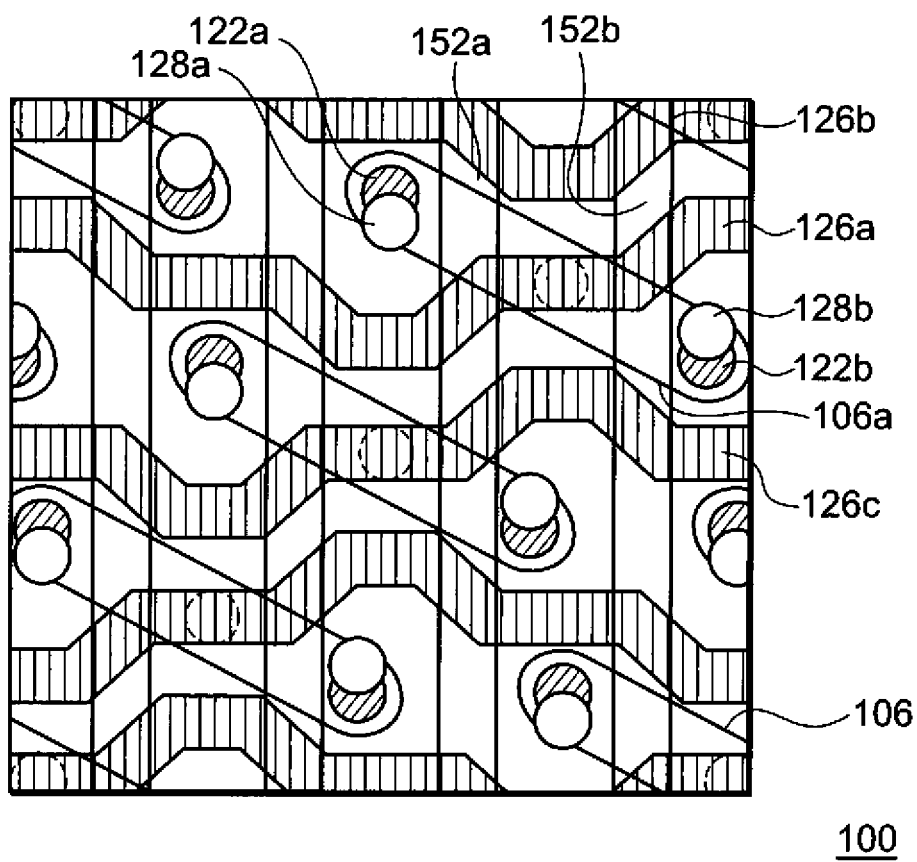
FIG. 8 is a plan view illustrating the portion enclosed by the dashed line in FIG. 7.
Figure 9:
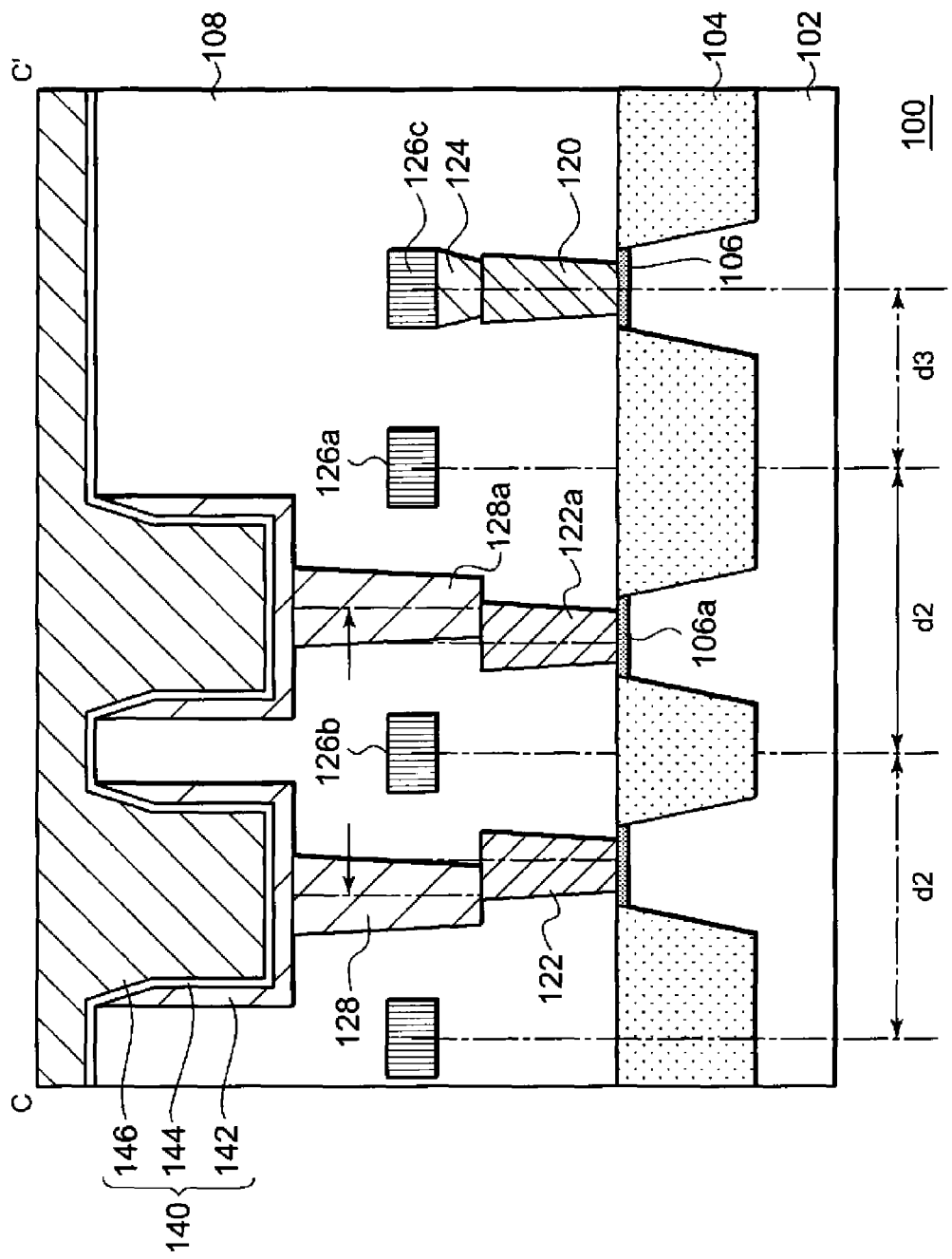
FIG. 9 is a cross-sectional view taken along line C-C' in FIG. 7.

The present embodiment differs from the first embodiment in the layout of the bit lines 126. FIG. 7 is a plan view illustrating a configuration of the semiconductor memory 100 according to the present embodiment. FIG. 8 is a plan view illustrating the portion enclosed by the dashed line in FIG. 7. FIG. 9 is a cross-sectional view taken along line C-C' in FIG. 7.

In the present embodiment, the interval of two adjacent bit lines 126 in a region in which a cell contact 122 and a capacitor contact 128 are provided therebetween is formed wider than the intervals in other regions. With respect to two adjacent bit lines 126, a pitch d2 of a portion in which the cell contact 122 and the capacitor contact 128 are provided is greater than a pitch d3 of a portion in which the lower-layer bit contact 120 and the upper-layer bit contact 124 are provided. In this case, a pitch between bit lines 126 is defined as the distance between center lines of the bit lines 126. The interval between two adjacent bit lines 126 in the portion in which the lower-layer bit contact 120 and the upper-layer bit contact 124 are provided corresponds to a minimum interval between the two bit lines. Moreover, in the present embodiment, the width of each bit line 126 can be set approximately constant. Accordingly, the local resistance values of the bit lines 126 can be set approximately constant regardless of the location.

In FIG. 8, in a similar manner as illustrated in FIG. 3 with respect to the first embodiment, the respective bit lines 126, gate lines 152, cell contacts 122, and capacitor contacts 128 are distinguished and assigned reference characters. To describe FIG. 8, the interval between a first bit line 126a and a second bit line 126b is formed wider in a region in which a first cell contact 122a and a first capacitor contact 128a are provided therebetween in comparison to intervals in other regions. Similarly, the interval between the first bit line 126a and a third bit line 126c is formed wider in a region in which a second cell contact 122b and a second capacitor contact 128b are provided therebetween in comparison to intervals in other regions.

In addition, the interval between the first bit line 126a and the second bit line 126b in the region in which the first cell contact 122a and the first capacitor contact 128a are provided therebetween is wider than the width between the first bit line 126a and the second bit line 126b in a region in which the lower-layer bit contact 120 and the upper-layer bit contact 124 are provided. Similarly, the interval between the first bit line 126a and the third bit line 126c in the region in which the second cell contact 122b and the second capacitor contact 128b are provided therebetween is wider than the width between the first bit line 126a and the third bit line 126c in the region in which the lower-layer bit contact 120 and the upper-layer bit contact 124 are provided.

Also in the present embodiment, the semiconductor memory 100 can be manufactured by a procedure similar to a manufacturing procedure for an ordinary DRAM described for the first embodiment by merely modifying a layout of the bit lines 126 and the like.

Advantages of the semiconductor memory 100 according to the present embodiment will now be described.

With the present embodiment, similar advantages as the semiconductor memory 100 according to the first embodiment can be achieved.

Figure 10A:
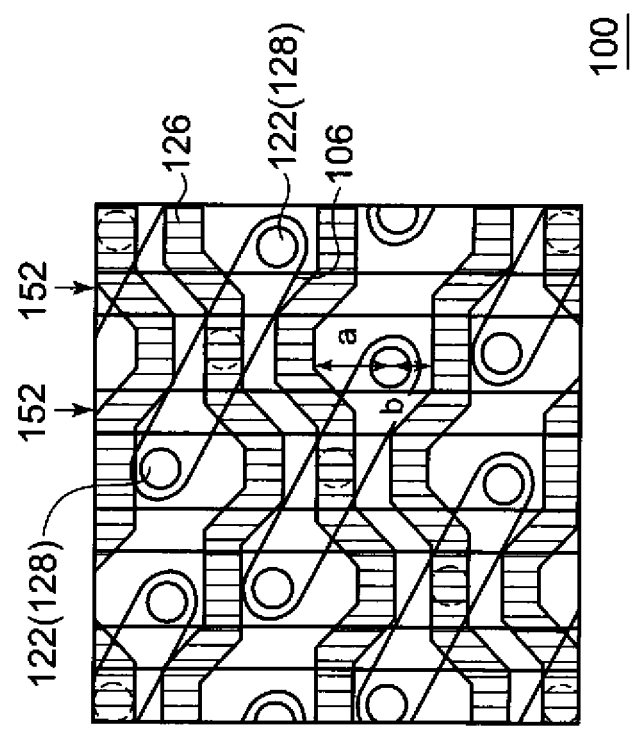
FIGS. 10A and 10B are plan views for describing the advantages of a semiconductor memory according to the second embodiment of the present invention.
Figure 10B:
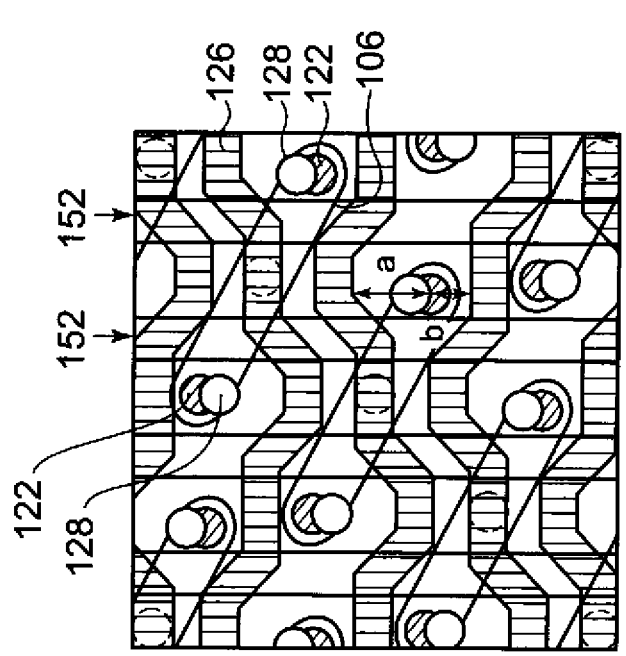

Further advantages of the semiconductor memory 100 according to the present embodiment will now be described with reference to FIG. 10. FIG. 10A is a plan view illustrating a configuration of the semiconductor memory 100 according to the present embodiment. FIG. 10B is a plan view illustrating, as reference, a configuration in which each capacitor contact 128 is formed so as to overlap a cell contact 122 on a lower layer thereof. The respective components illustrated in FIG. 10B are assigned the same reference characters as used in FIG. 10A.

In comparison to the configuration of the semiconductor memory described in Japanese Patent Laid-Open No. 2008-227477, in the configuration illustrated in FIG. 10(*b*), the pair of cell contacts 122 formed connected to one of the active areas 106 is arranged in a direction separating from the bit line 126 intersecting the active area 106. However, with this configuration, while the overlapping margin of the bit line 126 and the capacitor contact 128 on the side denoted by "a" in the diagram can be widened, the overlapping margin of the bit line 126 and the capacitor contact 128 on the side denoted by "b" in the diagram cannot be widened. On the other hand, with the semiconductor memory 100 according to the present embodiment illustrated in FIG. 10A, the overlapping margin of the bit line 126 and the capacitor contact 128 can be widened both on the side denoted by "a" as well as on the side denoted by "b" in the diagram. As shown, with the semiconductor memory 100 according to the present embodiment, advantages achieved by modifying the arrangement of the bit lines 126 can be further enhanced.

While embodiments of the present invention have been described with reference to the drawings, the embodiments merely exemplify the present invention and various configurations other than those presented above can be adopted.

In addition, although not particularly described, the semiconductor memory 100 may be arranged as a mixed DRAM in which a logic circuit is provided on the same substrate.

Furthermore, the widths of the bit lines need not be constant.

While configurations in which the gate line 152 is linearly formed have been shown for the embodiments described above, for example, patterns of the gate lines can be altered as illustrated in FIG. 10 of Japanese Patent Laid-Open No. 2008-227477. For example, the line width of the gate line 152 on the isolation film 104 between active areas 106 can be set narrower than the line width of the gate line 152 on the active areas 106. In other words, a configuration can be adopted which includes a gate line provided on a substrate, a plurality of active areas formed on the substrate, and an isolation film separating the plurality of active areas, wherein the width of a part of the gate lines is arranged so as to be narrower than the width of the other parts of the gate lines 152. In this case, the part of the gate lines whose width is narrow than that of the other parts may be provided on the isolation film. Consequently, the density of the arrangement of the gate lines 152 can be increased and a smaller chip size can be realized.

It is apparent that the present invention is not limited to the above embodiments, but may be modified and changed without departing from the scope and sprit of the invention.

What is claimed is:

1. A semiconductor memory including a DRAM comprising:
   a substrate;
   an isolation film formed on the substrate;
   a first active area separated by the isolation film;
   a first bit line formed on the first active area and a second bit line formed adjacent to the first bit line;
   a capacitor provided on a higher layer than the first bit line and the second bit line;
   a cell contact formed connected to the first active area on the first active area;
   a capacitor contact connecting the cell contact and the capacitor on the cell contact; and
   a bit contact connecting the first active area and the first bit line on the first active area, wherein
   the cell contact is provided at a position that is closer to the second bit line than to the first bit line, and a central axis of the capacitor contact is formed at a position that is closer to the first bit line than to a central axis of the cell contact, wherein an interval of the first bit line and the second bit line is formed wider in a region in which the capacitor contact and the cell contact are provided therebetween than in intervals in other regions.

2. The semiconductor memory according to claim 1, wherein the capacitor contact is positioned at approximately the center between the first bit line and the second bit line.

3. The semiconductor memory according to claim 1, further comprising
   a gate line provided on the substrate so as to intersect the first bit line and the second bit line, wherein
   the offset directions of the central axis of the capacitor contact and the central axis of the cell contact are parallel to the extended direction of the gate line.

4. The semiconductor memory according to claim 1, wherein
   the bit contact is formed connected to the first active area and is made up of a first bit contact formed at the same height as the cell contact and
   a second bit contact formed on the first bit contact and which is connected to the first bit contact and the first bit line,
   the bit line formed such that a lower face thereof is positioned higher than the height of an upper face of the cell contact by just the height of the second bit contact.

5. The semiconductor memory according to claim 1, wherein the DRAM has a ¼ pitch-layout structure in which a basic structure made up in units of four bit lines and four gate lines is repetitively arranged.

6. The semiconductor memory according to claim 1, wherein
   the interval of the first bit line and the second bit line is formed wider in the region in which the capacitor contact and the cell contact are provided therebetween than a width between the first bit line and the second bit line in the region in which the bit contact is included.

7. A semiconductor memory device according to claim 1, wherein the capacitor contact is provided at a position that is closer to the first bit line than to the cell contact.

8. A semiconductor memory device comprising:
   a first active area formed on a substrate and separated by an isolation film;
   a first bit line formed over the first active area;
   a second bit line and a third bit line formed, in a first direction, adjacent to the first bit line such that the first bit line is arranged, in the first direction, between the second bit line and the third bit line;
   a first capacitor element and a second capacitor element provided over a higher layer than the first bit line, the second bit line and the third bit line;
   a first cell contact and a second cell contact connected to the first active area on the first active area, the first bit line and the second bit line provided over a higher layer than the first and second cell contacts;

a first capacitor contact and a second capacitor contact connected to the first cell contact and the second cell contact, respectively, and directly contacting the first cell contact and the second cell contact, respectively;

the first capacitor contact and the second capacitor contact being electrically connected to the first capacitor element and the second capacitor element, respectively; and a bit contact formed connected to the first active area and electrically connected to the first bit line, wherein the first cell contact is provided, in the first direction, at a position that is closer to the second bit line than to the first bit line, wherein a distance, in the first direction, between the first capacitor contact and the first bit line is less than a distance, in the first direction, between the first cell contact and the first bit line, wherein the second cell contact is provided, in the first direction, at a position that is closer to the third bit line than to the first bit line, and wherein a distance, in the first direction, between the second capacitor contact and the first bit line is less than a distance, in the first direction, between the second cell contact and the first bit line.

9. The semiconductor memory device according to claim 8, wherein the first capacitor contact is positioned at approximately a center between the first bit line and the second bit line.

10. The semiconductor memory device according to claim 8, further comprising
a gate line provided on the substrate so as to intersect the first bit line and the second bit line, wherein
the offset directions of the central axis of the first capacitor contact and the central axis of the first cell contact are parallel to the extended direction of the gate line.

11. The semiconductor memory device according to claim 8, wherein
the bit contact is formed connected to the first active area and is made up of a first bit contact formed at the same height as the cell contact and
a second bit contact formed on the first bit contact and which is connected to the first bit contact and the first bit line,
the bit line formed such that a lower face thereof is positioned higher than the height of an upper face of the cell contact by just the height of the second bit contact.

12. A semiconductor memory device according to claim 8, wherein the capacitor contacts and the cell contacts are comprised of conductive plugs.

13. A semiconductor memory device comprising:
a first active area for memory cells formed on a substrate and separated by an isolation film;
a first bit line formed over the first active area and electrically coupled to the memory cells;
a second bit line and a third bit line formed, in a first direction, adjacent to the first bit line such that the first bit line is arranged, in the first direction, between the second bit line and the third bit line;
a first capacitor element and a second capacitor element for the memory cells provided over a higher layer than the first bit line, the second bit line and the third bit line;
a first cell contact and a second cell contact connected to the first active area on the first active area,
the first bit line, the second bit line and the third bit line being provided over a higher layer than the first and second cell contacts;
a first capacitor contact and a second capacitor contact connected to the first cell contact and the second cell contact, respectively, and directly contacting the first cell contact and the second cell contact, respectively; and
the first capacitor contact and the second capacitor contact being electrically connected to the first capacitor element and the second capacitor element, respectively,
wherein the first cell contact is provided, in the first direction, at a position that is closer to the second bit line than to the first bit line,
wherein a distance, in the first direction, between the first capacitor contact and the first bit line is less than a distance, in the first direction, between the first cell contact and the first bit line,
wherein the second cell contact is provided, in the first direction, at a position that is closer to the third bit line than to the first bit line, and
wherein a distance, in the first direction, between the second capacitor contact and the first bit line is less than a distance, in the first direction, between the second cell contact and the first bit line.

14. The semiconductor memory device according to claim 13, wherein the first capacitor contact is positioned at approximately a center between the first bit line and the second bit line.

15. The semiconductor memory device according to claim 13, further comprising
a gate line provided on the substrate so as to intersect the first bit line and the second bit line, wherein
the offset directions of the central axis of the first capacitor contact and the central axis of the first cell contact are parallel to the extended direction of the gate line.

16. A semiconductor memory device according to claim 13, wherein the capacitor contacts and the cell contacts are comprised of conductive plugs.

* * * * *